US011614921B2

(12) United States Patent
Tatarkiewicz et al.

(10) Patent No.: US 11,614,921 B2
(45) Date of Patent: Mar. 28, 2023

(54) METHOD AND APPARATUS FOR HIGHLY EFFECTIVE ON- CHIP QUANTUM RANDOM NUMBER GENERATOR

(71) Applicant: RANDAEMON sp. z o.o., Warsaw (PL)

(72) Inventors: Jan Jakub Tatarkiewicz, San Diego, CA (US); Wieslaw Bohdan Kuzmicz, Warsaw (PL)

(73) Assignee: RANDAEMON sp. z o.o., Warsaw (PL)

( * ) Notice: Subject to any disclaimer, the term of this patent is extended or adjusted under 35 U.S.C. 154(b) by 7 days.

(21) Appl. No.: 17/861,014

(22) Filed: Jul. 8, 2022

(65) Prior Publication Data

US 2023/0021552 A1  Jan. 26, 2023

Related U.S. Application Data

(60) Provisional application No. 63/279,587, filed on Nov. 15, 2021, provisional application No. 63/277,759, filed on Nov. 10, 2021, provisional application No. 63/270,912, filed on Oct. 22, 2021, provisional application No. 63/234,820, filed on Aug. 19, 2021, (Continued)

(51) Int. Cl.
*G01T 1/20* (2006.01)
*G06F 7/58* (2006.01)
*G06E 1/04* (2006.01)

(52) U.S. Cl.
CPC ............... *G06F 7/588* (2013.01); *G01T 1/20* (2013.01); *G06E 1/04* (2013.01)

(58) Field of Classification Search
CPC .............. G06F 7/588; G01T 1/20; G06E 1/04
See application file for complete search history.

(56) References Cited

U.S. PATENT DOCUMENTS 3,445,591 A  5/1969  Koehler
3,546,356 A  12/1970  Graybill
(Continued)

FOREIGN PATENT DOCUMENTS

WO  WO-02091147 A1 * 11/2002  ............. G06F 7/588
WO  2014/080272      5/2014
(Continued)

OTHER PUBLICATIONS

B. Škorić 2015 Lecture notes 2IMS10 Technical University Eindhoven (Holland) Physical aspects of digital security.
(Continued)

*Primary Examiner* — Kiho Kim
(74) *Attorney, Agent, or Firm* — Manuel de la Cerra (57) ABSTRACT

A true random number generator is presented that includes a CMOS matrix detector with a top surface. A shell is positioned over the top surface, and the shell includes a radiation source and a luminophore or scintillator constructed to emit photons towards the top surface when the luminophore or scintillator is struck by electrons from the radioactive decay of the source of the radiation. The CMOS detector matrix is constructed to detect the photons emitted from the luminophore or scintillator and to produce a signal for the detected photons. The signal is communicated to a processor that produces true random numbers based on the signal from the detected photons.

11 Claims, 5 Drawing Sheets

(Taken at line A-A)

Related U.S. Application Data provisional application No. 63/235,031, filed on Aug. 19, 2021, provisional application No. 63/224,811, filed on Jul. 22, 2021.

(56) References Cited

U.S. PATENT DOCUMENTS

| | | |
|---|---|---|
| 3,790,768 A | 2/1974 | Chevalier |
| 4,527,798 A | 7/1985 | Siekierski |
| 4,855,690 A | 8/1989 | Dias |
| 4,905,176 A | 2/1990 | Schulz |
| 5,570,307 A | 10/1996 | Takahshi |
| 5,627,894 A | 5/1997 | Albert |
| 5,732,138 A | 3/1998 | Noll |
| 5,987,483 A | 11/1999 | Edelkind |
| 6,249,009 B1 | 6/2001 | Kim |
| 8,001,054 B1 | 8/2001 | Peart |
| 6,346,700 B1 | 2/2002 | Cunningham |
| 6,415,309 B1 | 7/2002 | Shilton |
| 6,430,170 B1 | 8/2002 | Saints |
| 6,539,410 B1 | 3/2003 | Klass |
| 6,542,014 B1 | 4/2003 | Saito |
| 6,687,721 B1 | 2/2004 | Wells |
| 6,697,829 B1 | 2/2004 | Shilton |
| 6,745,217 B2 | 6/2004 | Figotin |
| 7,031,991 B2 | 4/2006 | Hars |
| 7,124,157 B2 | 10/2006 | Ikake |
| 7,476,370 B2 | 1/2009 | Mitsugashira |
| 8,001,168 B2 | 8/2011 | Tsuyuzaki |
| 8,037,117 B2 | 10/2011 | Saito |
| 9,335,972 B2 | 5/2016 | Yang |
| 10,430,161 B1 | 10/2019 | Tatarkiewicz |
| 11,036,473 B1 | 6/2021 | Tatarkiewicz |
| 2004/0035201 A1 | 2/2004 | Vincze |
| 2006/0010183 A1 | 1/2006 | Rabin |
| 2009/0165086 A1 | 6/2009 | Trichina |
| 2012/0030268 A1 | 2/2012 | Liu |
| 2015/0064047 A1 | 3/2015 | Elwha |
| 2018/0217817 A1 | 8/2018 | Gorfinkle |
| 2019/0258458 A1 | 8/2019 | Walmsley |
| 2019/0310830 A1 | 10/2019 | Tatarkiewicz |
| 2019/0347076 A1 | 11/2019 | Park |
| 2020/0065068 A1 | 2/2020 | Hekmatshoartabari |
| 2020/0092328 A1 | 3/2020 | Kim |
| 2020/0210147 A1 | 7/2020 | Lee |

FOREIGN PATENT DOCUMENTS

| | | | | |
|---|---|---|---|---|
| WO | 2014080272 A1 | 5/2014 | | |
| WO | WO-2020036259 A1 * | 2/2020 | ............... | C01G 9/08 |

OTHER PUBLICATIONS

D.F. Williams et al. 1993 Oak Ridge National Laboratory TM-12399 Recovery and Purification of Nickel-63 from HFIR-irradiated Targets.

J. von Neumann 1951 Res. Nat. Bur. Stand Appl Math Series 3, 36-38 Various techniques used in connection with random digits.

M.J. Berger and S.M. Seltzer 1982 National Bureau of Standards NBSIR 82-2550 Stopping Powers and Ranges of Electrons and Positrons.

M.-M. Bé et al. 2008 Bureau International des Poids et Mesures, Sevres (France) BIPM-5 vol 1-4 Table of Radionuclides.

Patuleanu et al. 2017 Proc. Romanian Acad. series A, vol. 18, 389-402 True random number sequences from gamma-decay using four extraction methods.

Jones on "True random number generators for a more secure IoT", Mar. 2016. Retrieved on [Oct. 29, 2020]. Retrieved from the Internet <https:l/www.techdesignforums.com/practice/technique/true-random-number-generators-for-more-secure-systems/> (Year: 2016).

S. Burri, D. Stucki, Y. Maruyama, C. Bruschini, E. Charbon and F. Regazzoni, "SPADs for quantum random numbers generators and U beyond," 2014 19th Asia and South Pacific Design Automation Conference (AS P-DAC), Singapore, 2014, pp. 788-794, doi: 10.11 09/ASPDAC.2014.6742986. (Year: 2014).

Duggirala R., Lal A., Radhakrishnan S. (2010) Radioisotope Decay Rate Based Counting Clock. In: Radioisotope Thin-Film Powered Microsystems. MEMS Reference Shelf, vol. 6. Springer, New York, NY. https://doi.org/10.1007/978-1-4419-6763-3_7 (Year: 2010).

Collantes et al. "Quantum Random Number Generators", 2016 Retrieved from the Internet <https://arxiv.org/pdf/1604.03304.pdf> (Year: 2016).

Rohe, "RANDy—A True-Random Generator Based On Radioactive Decay", 2003. Retrieved from the Internet <https://citeseerx.ist.psu.edu/viewdoc/download?doi=1 0.1.1.11 0.9725&rep=rep1 &type=pdf> (Year: 2003).

International Search Report and Written Opinion for PCT/US2019/017748 dated Dec. 30, 2019 (6 pages).

International Search Report in PCT/US2020/065962 dated Apr. 22, 2020 (6 pages).

International Search report for PCT/EP2022/070435 dated Nov. 17, 2022 (11 pages).

* cited by examiner

METHOD AND APPARATUS FOR HIGHLY EFFECTIVE ON- CHIP QUANTUM RANDOM NUMBER GENERATOR

PRIORITY APPLICATIONS AND REFERENCES

This application claims priority to U.S. Provisional Application Ser. 63/344,496 titled "Method and Apparatus for Highly Effective On-Chip Quantum Random Number Generator" filed on May 20, 2022; to U.S. Provisional Application Ser. 63/279,587 titled "Method for Cost-Effective Nickel-63 Radiation Source for True Random Number Generators" filed on Nov. 15, 2021; to U.S. Provisional Application Ser. 63/277,759 titled "Method for Cost-Effective Nickel-63 Radiation Source for True Random Number Generators" filed on Nov. 10, 2021; to U.S. Provisional Application Ser. 63/224,811 titled "Method And Apparatus For Highly Effective Beta Decay Based On-Chip True Random Number Generator" filed on Jul. 22, 2021; to U.S. Provisional Application Ser. 63/234,820 titled "Method And Apparatus For Highly Effective Beta Decay Based On-Chip True Random Number Generator" filed on Aug. 19, 2021; to U.S. Provisional Application Ser. 63/235,031 titled "Method And Apparatus For Highly Effective Beta Decay Based On-Chip True Random Number Generator" filed on Aug. 19, 2021; and to U.S. Provisional Application Ser. 63/270,912 titled "Method And Apparatus For True Random Number Generator Based On Nuclear Radiation" filed on Oct. 22, 2021, all of which are incorporated herein by reference in their entireties.

This application is also related to U.S. application Ser. No. 17/687,630 titled "Method for Making Cost-Effective Nickel-63 Radiation Source for True Random Number Generators" filed on Mar. 5, 2022; to U.S. application Ser. No. 17/513,661 titled "Method And Apparatus For Highly Effective Beta Decay Based On-Chip True Random Number Generator" filed on Oct. 28, 2021; to U.S. application Ser. No. 17/409,971 titled "Method And Apparatus For Highly Effective On-Chip True Random Number Generator Utilizing Beta Decay" filed on Aug. 24, 2021; to U.S. Provisional Application Ser. 62/984,528 titled "Method And Apparatus For Tritium-Based True Random Number Generator" filed on Mar. 3, 2020; to U.S. Provisional Application Ser. 63/062,672 titled "Method And Apparatus For Beta Decay Based True Random Generator" filed on Aug. 7, 2020; to U.S. Provisional Application Ser. 62/655,172 titled "Apparatus, Systems, And Methods Comprising Tritium Random Number Generator" filed on Apr. 9, 2018; to U.S. Provisional Application Ser. 62/803,476 titled "Apparatus, Systems, And Methods Comprising Tritium Random Number Generator" filed on Feb. 9, 2019, now U.S. Pat. No. 10,430,161; to U.S. application Ser. No. 16/273,365 titled "Apparatus, Systems, And Methods Comprising Tritium Random Number Generator" filed on Feb. 12, 2019; to U.S. application Ser. No. 16/990,087 titled "Apparatus, Systems, And Methods For Beta Decay Based True Random Number Generator" filed on Aug. 11, 2020, now U.S. Pat. No. 10,901,695; to U.S. application Ser. No. 17/126,265 titled "Method and Apparatus for Tritium-based True Random Number Generator" filed on Dec. 18, 2020, now U.S. Pat. No. 11,048,478; to U.S. application Ser. No. 17/062,307 titled "Apparatus, Systems, And Methods For Beta Decay Based True Random Number Generator" filed on Oct. 2, 2020, now U.S. Pat. No. 11,036,473; to PCT Application SN PCT/US19/17748 titled "Apparatus, Systems, And Methods Comprising Tritium Random Number Generator" filed on Feb. 13, 2019; to PCT Application SN PCT/US20/65962 titled "Apparatus, Systems, And Methods For Beta Decay Based True Random Number Generator" filed on Dec. 18, 2020; and to PCT Application SNPCT/US20/65976 titled "Apparatus, Systems, And Methods For Beta Decay Based True Random Number Generator" filed on Dec. 18, 2020. Each of the patent applications, issued patents, and other references discussed and/or cited herein, are incorporated by reference as if fully set forth herein.

TECHNICAL FIELD

The present disclosure relates generally to true random number generators, and more specifically to random number generator technologies utilizing the spontaneous Nickel isotope decay, as well as apparatus, systems, and methods regarding same.

BACKGROUND

As opposed to pseudo-random number generators based on numerical algorithms, there are true random number generator (TRNG) devices that depend on natural random processes: multiple bipolar switches, thermal noise, light scattering by dichroic mirrors, chaotic systems, and decay of radioactive nuclei. Some of these TRNGs are listed in the provisional applications to which the present application claims priority, and those references are incorporated herein by reference as if fully set forth herein.

The decay of radioactive nuclei type is considered to be the most independent from environmental influences like temperature, pressure, or acceleration. However, typical nuclear-based TRNGs require large size detectors to enable the registration of particles emitted as a result of radioactive decays. Also, many nuclei used in such devices are highly radioactive and poisonous, hence dangerous to humans if a device is broken.

In previous disclosures by the present inventors, a TRNG is disclosed. For example, U.S. Pat. No. 10,901,695 entitled "Apparatus, systems, and methods for beta decay based true random number generator", an array of detectors was employed and a method of adjusting counts by changing the read-out time was described. The contents of that patent are incorporated herein by reference. The source of entropy in the '695 patent was a thin layer of Nickel-63 attached to the inner surface of the metallic cover of the package of the integrated circuit (IC). Likewise, in U.S. Pat. No. 11,281,432 entitled "Method and apparatus for true random number generator based on nuclear radiation", an array of detectors was employed to detect electrons (i.e., entropy) from the radiation source. Further, the '432 patent disclosed a method of adjusting the counting rates of these detectors based on the varying diameter of their surface. The disclosed method is very effective in compensating for the limited (finite area) of the radiation source. However, designing and manufacturing such a detector array is complicated because typical electrical parameters of a single diode vary considerably with the area. The contents of both the '695 and '432 patents are incorporated herein by reference.

A solution might be to create a source of electrons that produces a very uniform flux through a given surface. The problem is well known in classical optics: using a single point source and a paraboloidal mirror one can produce the required uniform flux, an example of which is a typical automobile front headlight. Unfortunately, creating a point source of electrons or a mirror that reflects these electrons is not an easy task, especially if such a device should be mounted inside an integrated chip. The most obvious solution, i.e., placing the radiation source just over the detectors, could be not a practical one because of the sensitivity of the surface for any contaminants as well as for the mechanical separation needed if the radiation source is deposited on the enclosure to allow for temperature expansion. If there is a gap between detectors and the source, then outer pixels will not receive the same electron flux as those inside the matrix.

Therefore, a cost-effective method for making a radiation source in a TRNG with a more uniform flux would be advantageous. Such a TRNG can then be used in compact personal devices.

SUMMARY

In a first embodiment, a true random number generator is presented that includes a CMOS matrix detector with a top surface. A shell is positioned over the top surface, and the shell includes a radiation source and a luminophore or scintillator constructed to emit photons towards the top surface when the luminophore or scintillator is struck by electrons from the radioactive decay of the source of the radiation. The CMOS detector matrix is constructed to detect the photons emitted from the luminophore or scintillator and to produce a signal for the detected photons. The signal is communicated to a processor that produces true random numbers based on the signal from the detected photons. The shell may also include a material such as metal to block the emission of radioactive decay from escaping the TRNG. The shell may include three layers; the first layer comprises the luminophore or scintillator, the second layer comprises the radiation source, and the third layer comprises the material to block the emission of radioactive decay from the radiation source. The first layer is positioned closest to the top surface 16, and the third layer is positioned farthest from the top surface 16. The luminophore or scintillator may be comprised of NaI(TI), and the shell may be a half-dome.

In a second embodiment, a true random number generator (TRNG) is presented that includes a CMOS matrix detector with a top surface. A half-dome shell is positioned over the top surface, and the shell includes a first layer comprising a radiation source and a second layer comprising a material (such as metal) to block the emission of radioactive decay. The first layer is positioned closest to the top surface, and the second layer is positioned farthest from the top surface. The CMOS matrix detector is constructed to detect electrons emitted from the decay of the radioactive source and to produce a signal for the detected photons. The signal is communicated to a processor that produces true random numbers based on the signal from the detected photons.

In either embodiment, the TRNG may have a radioactive source of Nickel-63, and the detector may be comprised of an array of detectors. Either embodiment may be integrated into a self-contained microchip.

Additional aspects, alternatives, and variations as would be apparent to persons of skill in the art are also disclosed herein and are specifically contemplated as included as part of the invention. The invention is set forth only in the claims as allowed by the patent office in this or related applications, and the following summary descriptions of certain examples are not in any way to limit, define or otherwise establish the scope of legal protection.

BRIEF DESCRIPTION OF DRAWINGS

The invention can be better understood with reference to the following figures. The components within the figures are not necessarily to scale, emphasis instead being placed on clearly illustrating example aspects of the invention. In the figures, like reference numerals designate corresponding parts throughout the different views and/or embodiments. Furthermore, various features of different disclosed embodiments can be combined to form additional embodiments, which are part of this disclosure. It will be understood that certain components and details may not appear in the figures to assist in more clearly describing the invention.

DETAILED DESCRIPTION OF EXAMPLE EMBODIMENTS

Reference is made herein to some specific examples of the present invention, including any best modes contemplated by the inventor for carrying out the invention. Examples of these specific embodiments are illustrated in the accompanying figures. While the invention is described in conjunction with these specific embodiments, it will be understood that it is not intended to limit the invention to the described or illustrated embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, process operations well known to persons of skill in the art have not been described in detail in order not to obscure unnecessarily the present invention. Various techniques and mechanisms of the present invention will sometimes be described in singular form for clarity. However, it should be noted that some embodiments include multiple iterations of a technique or multiple mechanisms unless noted otherwise. Similarly, various steps of the methods shown and described herein are not necessarily performed in the order indicated, or performed at all in certain embodiments. Accordingly, some implementations of the methods discussed herein may include more or fewer steps than those shown or described. Further, the techniques and mechanisms of the present invention will sometimes describe a connection, relationship, or communication between two or more entities. It should be noted that a connection or relationship between entities does not necessarily mean a direct, unimpeded connection, as a variety of other entities or processes may reside or occur between any two entities. Consequently, an indicated connection does not necessarily mean a direct, unimpeded connection unless otherwise noted.

The following list of example features corresponds to the attached figures and is provided for ease of reference, where like reference numerals designate corresponding features throughout the specification and figures:

| | |
|---|---|
| Half-Sphere Cover | 10 |
| CMOS Matrix | 15 |
| Shell | 20 |
| Radiation Source | 25 |
| Luminophore/scintillator | 30 |
| Self-Contained TRNG Chip | 35 |
| Area for Additional Integrated Circuit Components | 40 |
| Processor | 45 |

This is related to our previously published US patents and applications listed above, in which we described the general idea of using pure beta minus (electron emission) nuclear decay as a medium or source of entropy for generating true random numbers by detecting emitted electrons on-chip through an electronic sensor or array of sensors. In this application, we present an approach to manufacturing the radiation source to be used in the previously disclosed TRNGs, as a thin layer without handling concerns. The radioactive source may be electro-deposited; $^{63}$Ni is available in a solution as Nickel chloride.

Figure 1:
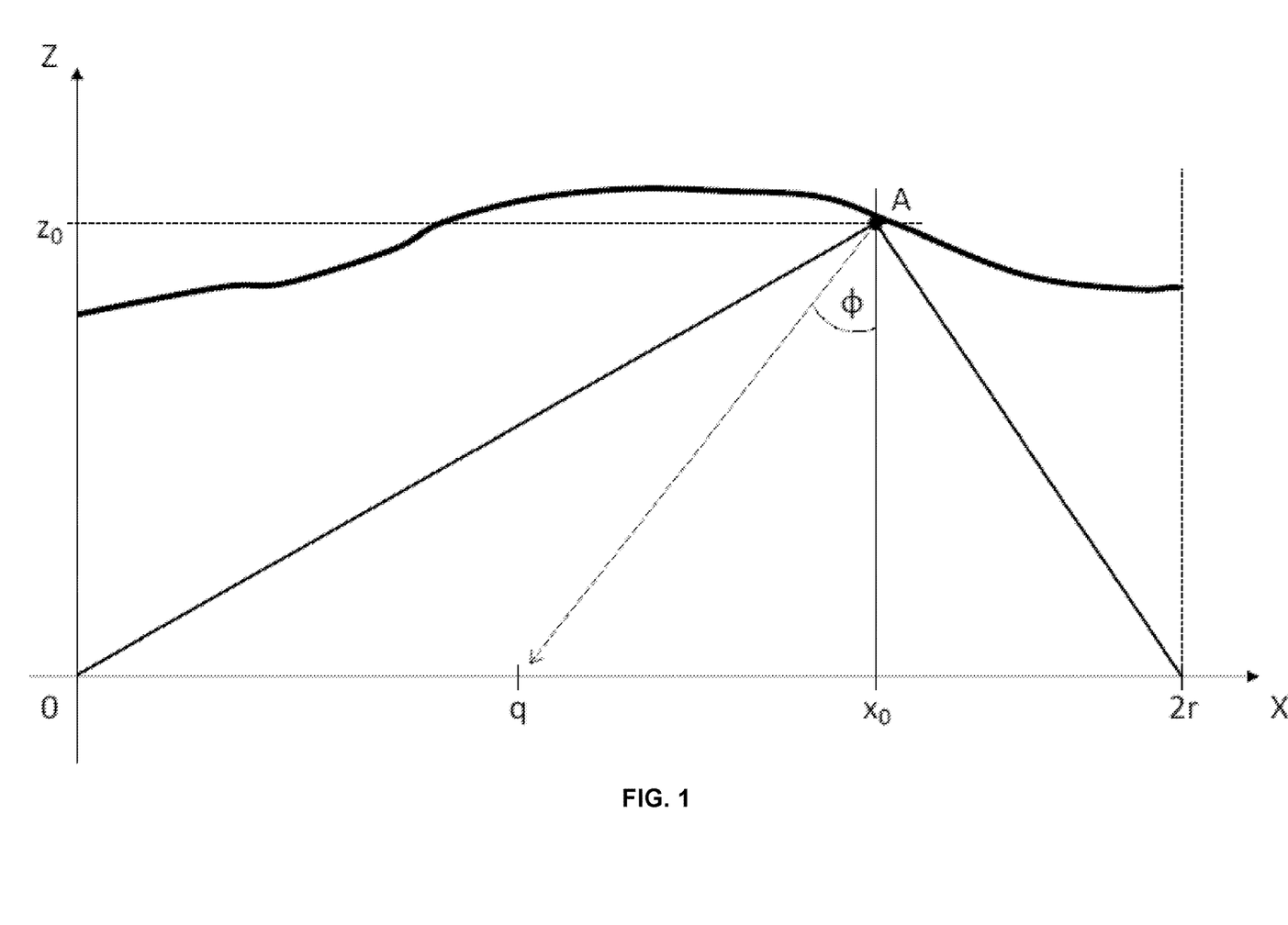
FIG. 1 illustrates the problem of calculating the path of electrons emitted from a point source.
Figure 2A:
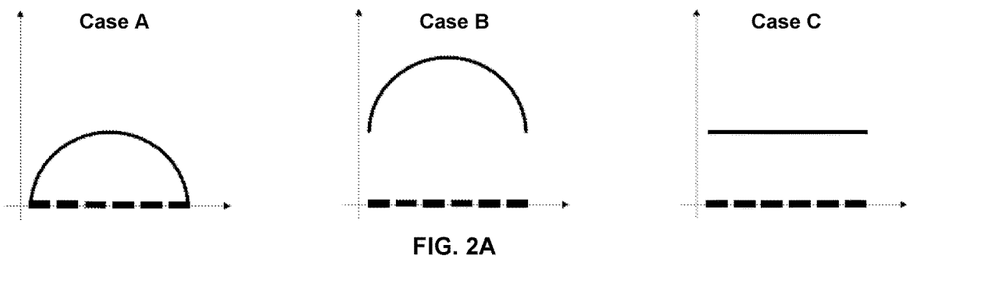
FIG. 2A illustrates three different radiation sources A, B, and C that are modeled in FIG. 2B.
Figure 2B:
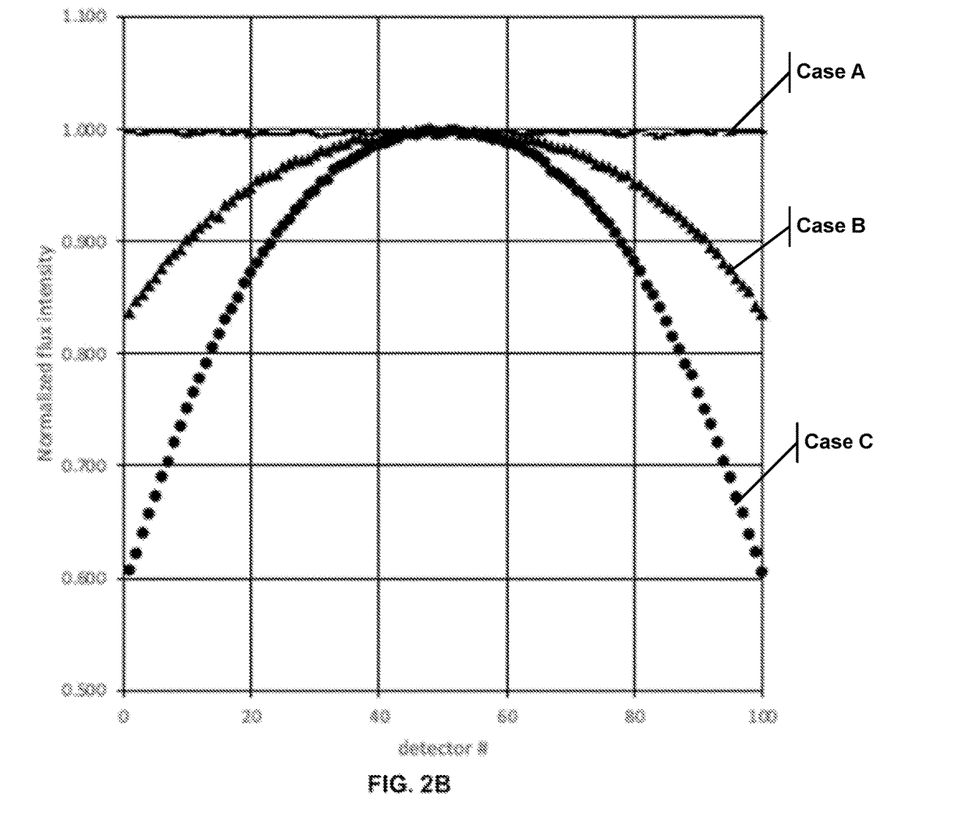
FIG. 2B graphs the radiation flux across an array of detectors for radiation sources of A, B, and C in FIG. 2A.

Here we propose a design of a radiation source on some surface placed above the array of the same detectors. FIG. 1 illustrates the problem of calculating the path of electrons emitted from point A into the direction of the array of detectors (placed on the surface z=0) with the emission angle φ measured from the line being perpendicular to the surface of the detectors' array. In general, such a problem in 3D would require complicated stereo geometrical expressions and integration over the whole surface on which the radiation source is placed. By assuming rotational symmetry around the axis placed at x=r, this can be simplified, but the integration will still require the path integrals of complicated trigonometric formulas, cf. e.g., our previous patents, which were the simplest case where a surface is just a plane placed at z=$z_0$. Instead of attempting to solve analytically these complicated equations, a Monte Carlo simulation of a large number of particles placed at various, random positions on the plane (parameter $x_0$) and randomly emitted at various angles φ was employed. The surface is given as a function z(x), for example, a half-spherical one is defined by:

$$z=\overrightarrow{r^2-(x-r)^2}+h \quad (1)$$

where r is the radius of the sphere, h is the distance between the center of the sphere and the detectors' surface (h=0 if the half-sphere sits on the surface as shown in FIG. 2A diagram Case A) while x∈[0;2r]. The Monte Carlo simulation was performed and an expected, uniform distribution across all the detectors for a spherical surface source was obtained, cf. FIG. 2B, case A. The software allows easy replication of the results obtained analytically in the previous patent by setting:

$$z=h \quad (2)$$

Using the same simulations, data was obtained for an area of the source equal to the area of detectors. This structure is shown in FIG. 2A diagram Case C, with the flux shown graphically in FIG. 2B, case C.

Assuming h>0, one can test the situation when the sphere is lifted slightly above the detector's surface. This structure is shown in FIG. 2A diagram Case B, with the flux shown graphically in FIG. 2B, case B, which results fall in between the other simulations.

Figures 3A, 3B:
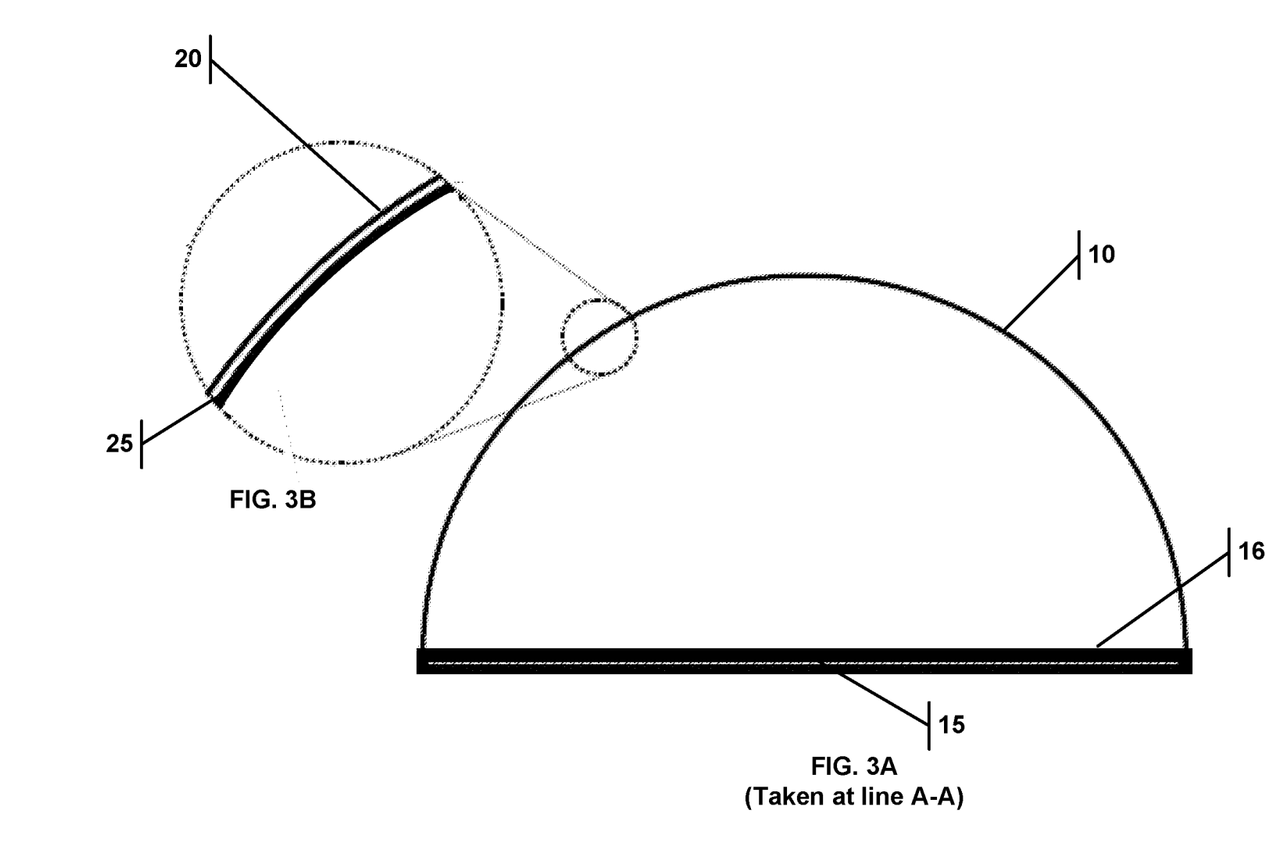
FIG. 3A illustrates a half-sphere radiation source over a CMOS matrix taken at the cross-section shown in line A-A of FIG. 5.
FIG. 3B illustrates in greater detail the layers of the dome over the CMOS matrix.

FIG. 3A (a cross-section taken at line A-A in FIG. 5) illustrates a TRNG that implements the more even electron flux produced by the half-dome. The TRNG includes a CMOS matrix detector 15 with a top surface 16. A half-dome shell 10 is positioned over the top surface 16, and the shell 10 includes a first layer comprising a radiation source 25 and a second layer comprising a material 20 (such as metal) to block the emission of radioactive decay, see FIG. 3A. The first layer is positioned closest to the top surface 16, and the second layer is positioned farthest from the top surface 16. The CMOS matrix detector 15 is constructed to detect electrons emitted from the decay of the radioactive source 25 and to produce a signal for the photons to be detected. The signal is communicated to a processor 45 (see FIG. 5) that produces true random numbers based on the signal from the detected photons.

It is worth noting that to get accurate, smooth solutions to the problem (as shown in FIG. 2B), one has to generate a large number of electrons—for this simulation we used 100 million electrons. Interestingly, Visual Basic's intrinsic random number generator—the program used for the simulation—has a limited cycle of random numbers (it is an algorithmic generator) of only about 16·10$^6$ different numbers from the range of [0,1]. Hence, we used the pseudo-random number generator subroutine based on the Wichman-Hill algorithm (B. A. Wichman and I.D. Hill *An Efficient and Portable Pseudo-random Number Generator*, Journal of the Royal Statistical Society Series C (Applied Statistics) Vol. 31, No. 2 (1982) pp. 188-190) that generates sequences of the length of about 2.8·10$^{13}$ numbers, i.e., large enough so not a single number is being reused in any given software run. This practical example clearly shows that good random number generators should be a hardware part of any workstation so that users do not need to worry about imperfections of random numbers used.

Detecting electrons is slightly more complicated than detecting photons (different interactions with solid matter) so we propose another modification of the radiation source used in the described detector's matrix-based random number generator. If the thin layer of the electron radiation source (in our case Nickel-63 source is thin because the self-absorption of electrons makes the thicker layer redundant) is covered with a thin layer of a luminophore or other scintillation chemical (like widely used NaI(Tl) coating), it can produce many thousands of photons in a visible light spectrum per single electron captured.

Figures 4A, 4B:
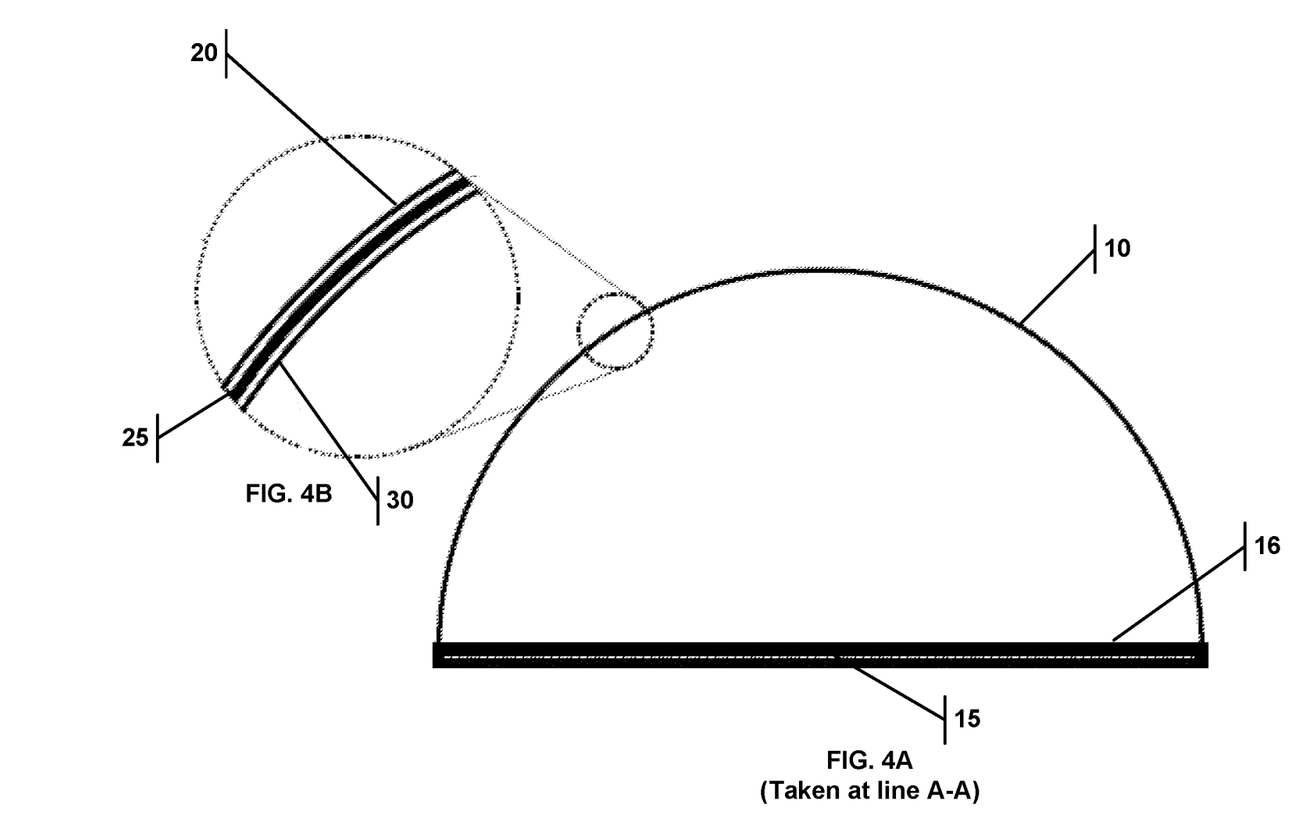
FIG. 4A illustrates a half-sphere radiation source with a luminophore/scintillator over a CMOS matrix taken at the cross-section shown in line A-A of FIG. 5.
FIG. 4B illustrates in greater detail the layers of the dome with a luminophore or scintillator over the CMOS matrix.

One possible construction is shown in FIG. 4A (a cross-section taken at line A-A in FIG. 5), where a half-sphere cover 10 is comprised of a shell 20, a radiation source 25 (e.g., Nickel-63), and luminophore/scintillator 30. This allows the use of a standard CMOS matrix 15 of detectors available commercially with over 20 million pixels and a readout time of less than 10 ms per frame (more than 100 frames per second). This means that by comparing the numbers of photons detected by each pixel of a single frame with a median count (calculated during initialization of the system from the frequency histogram of counts), one can generate random bits at about 2 Gb/sec from the CMOS array that covers not much more than 1 cm$^2$. The extraction of entropy is simple in this case: pixel counts lower than median mean zero, pixel counts higher than median mean one. This is an ultimate high speed and high throughput quantum random number generator using an ultimate entropy source (beta decay) that cannot be influenced by any environmental factors and does not change much with time.

The TRNG in FIG. 4A includes a CMOS matrix detector 15 with a top surface 16. A shell 10 is positioned over the top surface 16, and that shell 10 includes a radiation source 25 and a luminophore or scintillator 30 constructed to emit photons towards the top surface 16 when the luminophore or scintillator 30 is struck by electrons from the radioactive decay of the source of the radiation 25. The CMOS detector matrix 15 is constructed to detect the photons emitted from the luminophore or scintillator 30 and to produce a signal for the detected photons. The signal is communicated to a processor 45 (see FIG. 5) that produces true random numbers based on the signal from the detected photons. The shell 10 may also include a material 20 such as metal to block the emission of radioactive decay from escaping the TRNG. The shell, as shown in the detail in FIG. 4B, may include three layers; the first layer comprises the luminophore or scintillator 30, the second layer comprises the radiation source 25, and the third layer comprises the material 20 to block the emission of radioactive decay from the radiation source 25. The first layer is positioned closest to the top surface 16, and the third layer is positioned farthest from the top surface 16.

Even if traditional LED light sources can be placed inside a spherical dome, they are still not stable over a long time. On the other hand, beta decays of Nickel-63 have a half-life time of about 100 years, which means that the flux of electrons diminishes only by about 0.7% per year, which is over two orders of magnitude smaller than the flux itself. Also, a fluorophore or scintillator, although subject to radiation damage, will last for more than 10 years of a practical lifetime of the described high throughput random number generator. With about $10^{22}$ molecules of luminophore or scintillation chemical per mole in normal conditions, even if each electron will damage one molecule permanently, and with a flux of $10^8$ electrons impinging luminophore or scintillator per second, after 10 years of irradiations (about $3 \cdot 10^8$ seconds) there will be still orders of magnitude more fresh molecules that will be able to emit photons.

Figure 5:
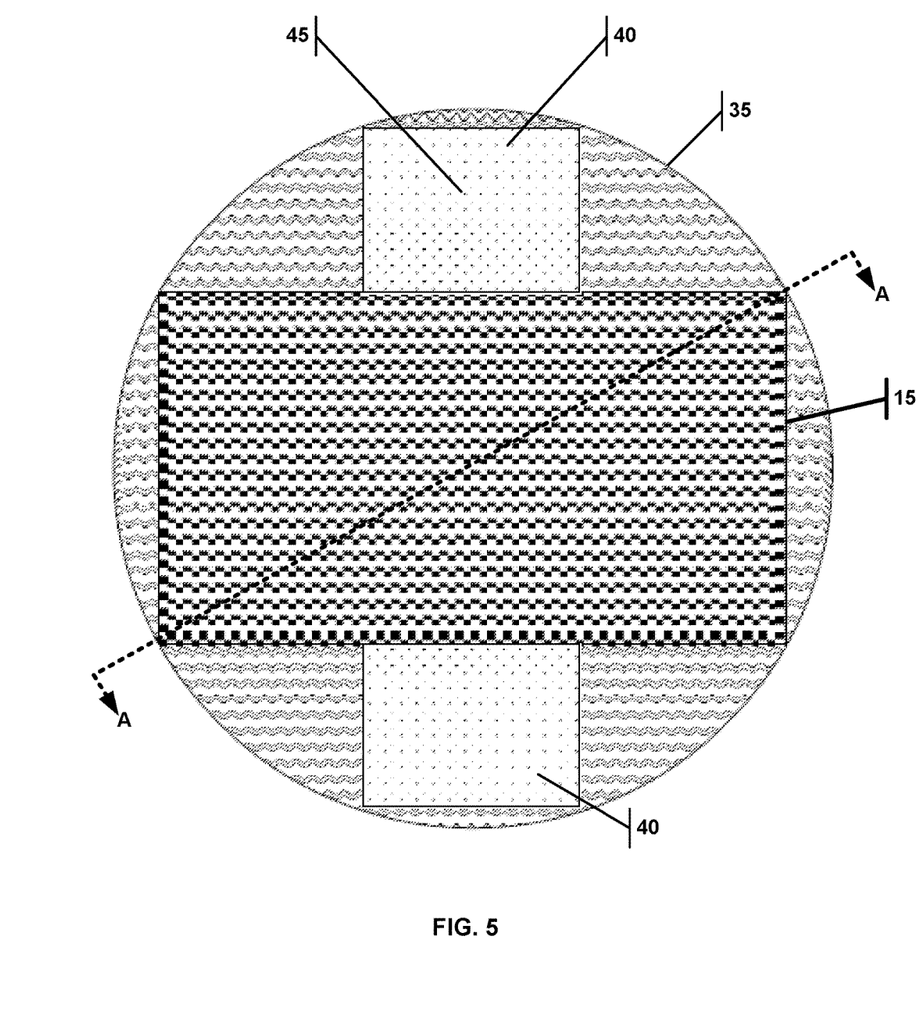
FIG. 5 illustrates a self-contained TRNG chip.

Most commercial CMOS matrices have a ratio of edges of about 9 to 16 (the HD video format) which means that a spherical dome will leave enough space on the sides of such a CMOS to be used for accompanying ICs, presumably manufactured on the very same piece of silicon so the whole unit will be self-contained random number generator system-on-chip. FIG. 5 illustrates a self-contained TRNG chip 35 with the CMOS matrix 15 and areas 40 on both sides of the CMOS matrix 15 that may be used for additional IC components. One such component that may be included in the self-contained chip is a processor 45 that produces true random numbers based on the signal from the detector.

Let us do some estimates of the amounts of radiational source needed. Assuming matrix pixels size of 5 microns by 5 microns and the source placed just on the matrix (no gap), one obtains about 140 electrons hitting each pixel per second assuming 15 mCi surface activity. This means that one can read out such a matrix at least 100 times per second knowing that on average each pixel will be hit at least once. If the matrix can be only read less frequently, then the radiational source can be thinner, thus producing fewer electrons per second which can be advantageous because of the cost of Nickel-63. The same applies to larger pixels, for example, 10 microns by 10 microns pixels will be hit by at least 550 electrons per second, etc. Since the area of the half-sphere as described above is about 2 times larger than the area covered by the matric comparable with the area of the sphere cross-section, the source can be even thinner.

Provided in the Appendix are calculations for the performance of the TRNG based on a new Canon SPAD sensor, see https://global.canon/en/news/2021/20211215.html. It is found that the Canon SPAD sensor can produce 0.27 GB/sec/cm$^2$. Thus, to obtain 2 GB/sec, a 10 cm$^2$ matrix is necessary (about 3.15 cm×3.15 cm or about 1.5 in.×1.5 in. area). With a PCB having an area of 150 cm$^2$, one can achieve up to 30 GB/sec provided that one can get consistent throughput throughout the interface of PCB like PCI Express. Practically, it may be more effective to network several smaller PCBs if such a high throughput is necessary.

Any of the suitable technologies, materials, and designs set forth and incorporated herein may be used to implement various example aspects of the invention, as would be apparent to one of skill in the art.

Although exemplary embodiments and applications of the invention have been described herein including as described above and shown in the included example Figures, there is no intention that the invention is limited to these exemplary embodiments and applications or to how the exemplary embodiments and applications operate or are described herein. Indeed, many variations and modifications to the exemplary embodiments are possible, as would be apparent to a person of ordinary skill in the art. The invention may include any device, structure, method, or functionality, as long as the resulting device, system, or method falls within the scope of one of the claims that are allowed by the patent office based on this or any related patent application.

APPENDIX

ESTIMATES FOR MATRIX SYSTEM
Canon SPAD matrix with 3.20E+06 pixels:

| | | |
|---|---|---|
| size = | 13.2 mm by 9.9 mm | |
| area = | 1.31 cm$^2$ | |
| diagonal = | 16.5 mm | |
| half-sphere surface = | 4.28 cm$^2$ | |
| $^{63}$Ni activity = | 15 mCi/cm$^2$; 1 mCi = 3.70E+07 decay s/sec | |
| effectivity = | 50% MC simulated | |
| flux = | 3.63E+08 decay s/sec | |
| per pixel | 113 e$^-$/sec | |
| fps = | 110 | |
| throughput = | 3.52E+08 bit/sec | |
| or | 0.35 Gb/sec | |
| or | 0.27 Gb/(sec · cm$^2$) | |

For more info on Canon SPAD sensors see https://global.canon/en/news/2021/20211215.html.

The invention claimed is:

1. A true random number generator (TRNG) comprising:
    a detector with a top surface;
    a shell position over the top surface, the shell comprising:
        a radiation source; and
        a luminophore or scintillator constructed to emit photons towards the top surface when the luminophore or scintillator is struck by electrons from the radioactive decay of the radiation source;
    wherein the detector is constructed to detect the photons emitted from the luminophore or scintillator, and to produce a signal for the detected photons; and
    a processor connected to the detector and constructed to produce true random numbers based on the signal from the detected photons.

2. The TRNG of claim 1, wherein the radioactive source is Nickel-63.

3. The TRNG of claim 1, wherein the luminophore or scintillator is comprised of NaI(Tl).

4. The TRNG of claim 1, wherein the detector comprises an array of detectors.

5. The TRNG of claim 1, wherein the shell comprises a material to block the emission of radioactive decay.

6. The TRNG of claim 1 wherein the shell comprises:
a first layer comprising the luminophore or scintillator;
a second layer comprising the radiation source; and
a third layer comprising a material to block the emission of radioactive decay from the radiation source;
wherein the first layer is positioned closest to the top surface, and the third layer is positioned farthest from the top surface.

7. The TRNG of claim 1, wherein the shell is a half-dome.

8. A self-contained microchip comprising the TRNG of claim 1.

9. The TRNG of claim 1, wherein the radioactive source is Nickel-63.

10. The TRNG of claim 1, wherein the detector comprises an array of detectors.

11. A true random number generator (TRNG) comprising:
a detector with a top surface;
a half-dome shell position over the top surface, the shell comprising:
a first layer comprising a radiation source; and
a second layer comprising a material to block the emission of radioactive decay; wherein the first layer is positioned closest to the top surface, and the second layer is positioned farthest from the top surface;
wherein the detector is constructed to detect electrons emitted from the decay of the radioactive source, and to produce a signal for the detected photons; and
a processor connected to the detector and constructed to produce true random numbers based on the signal from the detected photons.

* * * * *